United States Patent [19]

Toda et al.

[11] Patent Number: 4,984,216

[45] Date of Patent: Jan. 8, 1991

[54] OPERATION MODE SETTING CIRCUIT FOR DRAM

[75] Inventors: Haruki Toda, Yokohama; Shigeo Ohshima, Tokyo; Tatsuo Ikawa, Mitaka, all of Japan

[73] Assignee: Kabushiki Kaisha Toshiba, Kawasaki, Japan

[21] Appl. No.: 307,701

[22] Filed: Feb. 8, 1989

[30] Foreign Application Priority Data

Feb. 12, 1988 [JP] Japan .................................. 63-30441

[51] Int. Cl.$^5$ ................................................ G11C 8/00
[52] U.S. Cl. ............................... 365/230.08; 365/222; 365/189.05
[58] Field of Search ............... 365/230.08, 193, 189.11, 365/189.05, 222

[56] References Cited

U.S. PATENT DOCUMENTS 4,802,135 1/1989 Shinoda et al. ...................... 365/233

OTHER PUBLICATIONS

Nikkei Electronics, 1987, 10.5 (No. 431), pp. 115–130 at p. 125.

*Primary Examiner*—Joseph A. Popek
*Attorney, Agent, or Firm*—Finnegan, Henderson, Farabow, Garrett, and Dunner

[57] ABSTRACT

A signal externally supplied to determine the operation mode is supplied to a first buffer circuit. A $\overline{CAS}$ signal is supplied to a second buffer circuit. The signals whose levels are converted by the first and second buffer circuits are supplied to a mode selection circuit. The operation of the mode selection circuit is controlled by a $\overline{RAS}$ signal, and it latches and outputs a mode selection signal based on the outputs of the first and second buffer circuits. An externally supplied address signal and an address signal formed in the device are supplied to address buffer circuit. The address buffer circuit selects one of the received address signals based on the $\overline{RAS}$ signal anad the mode selection signal output from the mode selection circuit. A selected one of the address signals is supplied to a word line selection/driving circuit. When a mode other than the auto-refresh mode is specified, the mode setting signal is set up before the $\overline{RAS}$ signal is activated. The set-up allowance time with respect to the activation timing of the $\overline{RAS}$ signal is set to be larger than the minimum value of the set-up allowance time of the external address signal. The mode setting signal is latched by the mode selection circuit when the $\overline{RAS}$ signal is activated. The latched signal is used to select and control the operation mode.

17 Claims, 7 Drawing Sheets

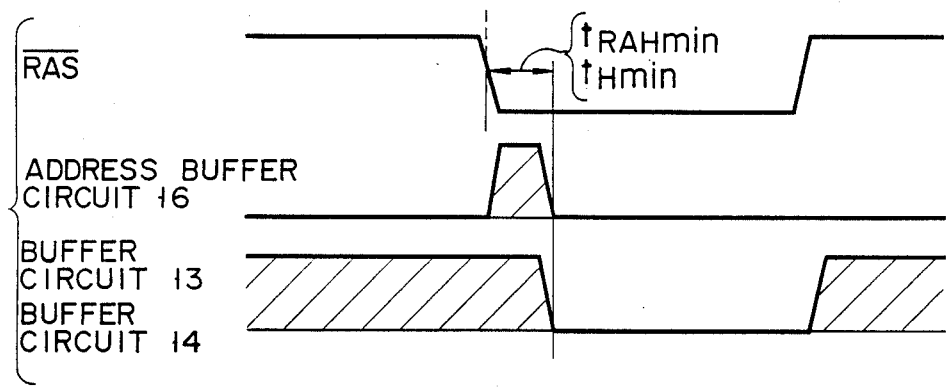
FIG. 5
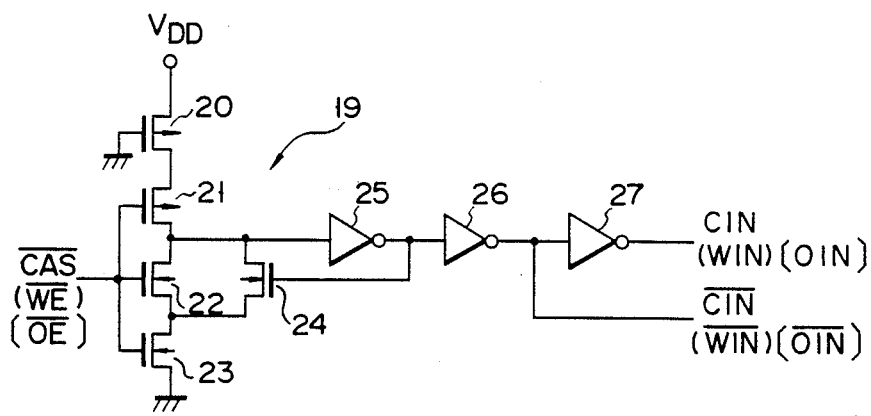
FIG. 6A
| $\overline{CAS}$ | 0 | CIN = 0 , | $\overline{CIN}$ = 1 |
|---|---|---|---|
|  | 1 | CIN = 1 , | $\overline{CIN}$ = 0 |
| $\overline{WE}$ | 0 | WIN = 0 , | $\overline{WIN}$ = 1 |
|  | 1 | WIN = 1 , | $\overline{WIN}$ = 0 |
| $\overline{OE}$ | 0 | OIN = 0 , | $\overline{OIN}$ = 1 |
|  | 1 | OIN = 1 , | $\overline{OIN}$ = 0 |
FIG. 6B

| | | | T1 | T2 | T3 | T4 | T5 | T6 | T7 | T8 |
|---|---|---|---|---|---|---|---|---|---|---|
| CAS | WE | OE | | | | | | | | |
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

AT THE TIME OF FALL OF RAS

CAS-BEFORE-RAS

| CAS-BEFORE-RAS | AT THE TIME OF FALL OF RAS | | | Ti (Ti="1") | MODE SIGNAL | MODE |
|---|---|---|---|---|---|---|
| | CAS | WE | OE | | | |
| | 0 | 0 | 0 | T1 | AR | AUTO-REFRESH |
| | 0 | 0 | 1 | T2 | SF1 | SPECIAL FUNCTION 1 |
| | 0 | 1 | 0 | T3 | AR | AUTO-REFRESH |
| | 0 | 1 | 1 | T4 | SF2 | SPECIAL FUNCTION 2 |
| | 1 | 0 | 0 | T5 | SF1 | SPECIAL FUNCTION 1 |
| | 1 | 0 | 1 | T6 | N | NORMAL (READ/WRITE) |
| | 1 | 1 | 0 | T7 | N | NORMAL (READ/WRITE) |
| | 1 | 1 | 1 | T8 | SF3 | SPECIAL FUNCTION 3 |
F I G. 8
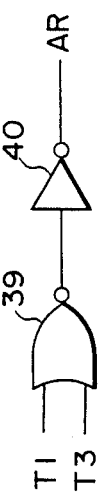
F I G. 9
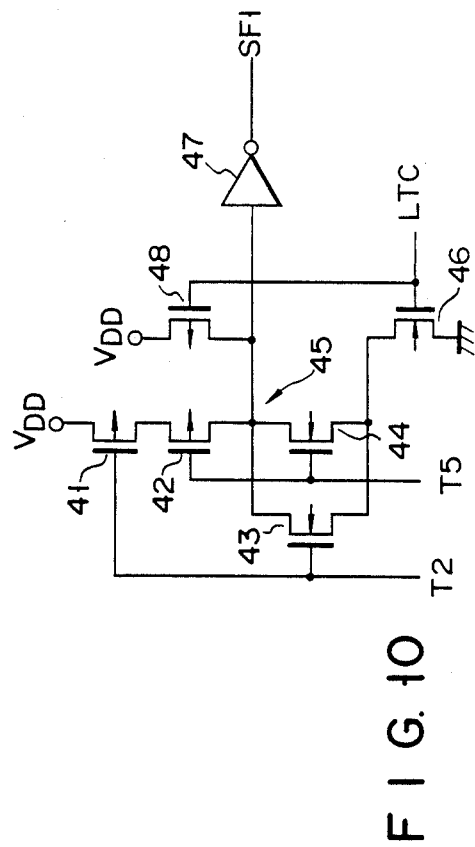
F I G. 10

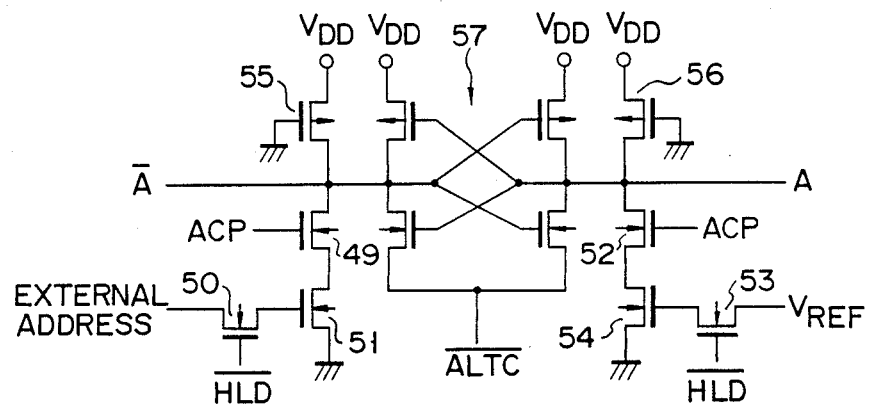
F I G. 11A
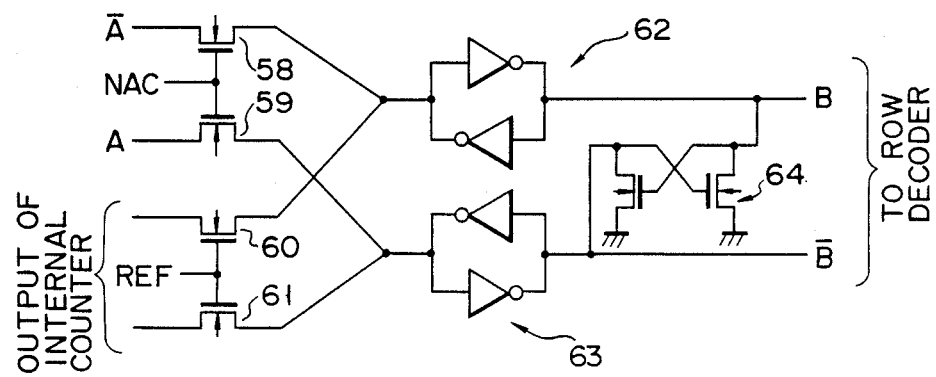
F I G. 11B

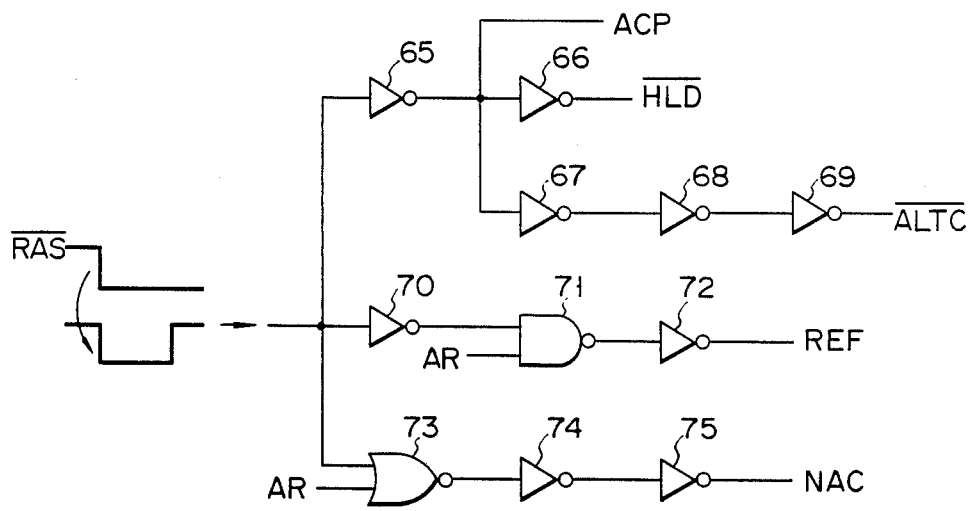
F I G. 12
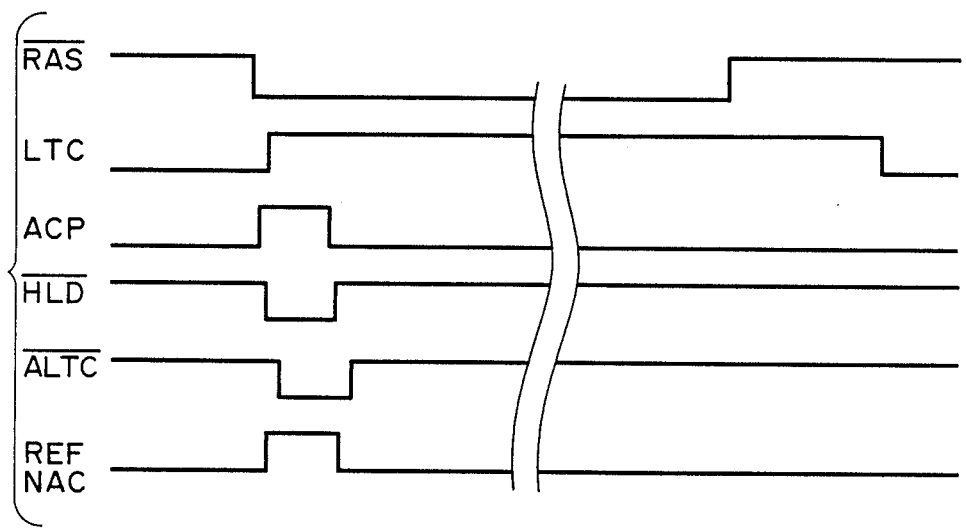
F I G. 13

OPERATION MODE SETTING CIRCUIT FOR DRAM

BACKGROUND OF THE INVENTION

1. Field of the Invention

This invention relates to a semiconductor integrated circuit device having a dynamic type random access memory (which is hereinafter referred to as DRAM) contained therein, and more particularly to an operation mode setting circuit, which may be used for a memory integrated circuit device of an image process circuit, for example, for setting the operation mode of the DRAM in response to a $\overline{CAS}$ (column address strobe) signal received before the input of a $\overline{RAS}$ (row address strobe) signal.

2. Description of the Related Art

Recently, there is a tendency to incorporate various functions into a single memory integrated circuit device to attain multi-function modes. For example, in the case of DRAM integrated circuit devices of one-bit output configuration, $\overline{RAS}$, $\overline{CAS}$ and $\overline{WE}$ (write enable) signals are used as control signals. When a combination of these control signals is used to set the operation mode, it is possible to determine the subsequent operation mode of the memory by use of the $\overline{CAS}$ and $\overline{WE}$ signal conditions which are set at the time of fall of the $\overline{RAS}$ signal. In this case, it is theoretically possible to set $2^2 = 4$ different types of modes. However, it is necessary to consider the following matter as a problem inherent to the DRAM. In general, a mode in which the $\overline{CAS}$ signal is set at a low level (active level), at the time of fall of the $\overline{RAS}$ signal, is used as an auto-refresh mode, and in this mode, the refresh operation is effected according to a row address generated from a counter in the memory. In the refresh mode, no column address is necessary and it is not necessary to fetch an external address according to the $\overline{CAS}$ signal. Therefore, when the $\overline{CAS}$ signal is thus set at the low level, it is generally difficult to specify an operation mode in which a column address or row address from the exterior is required.

Recently, however, memories having serial successive input/output ports have been developed as image processing memory integrated circuit devices, and with this memory development, various modes in which specification of the column address is not required have been provided. For example, since the contents of a group of memory cells specified by a single row address are collectively transferred in each operation of data transfer between the serial input/output section and memory section, the column address is not required. Further, since the contents of a group of memory cells specified by a single row address are written at the same time in the flash write mode corresponding to a high-speed image clearing mode or the like, the column address is not required. Therefore, there is a possibility that the mode for inputting the $\overline{CAS}$ signal before the $\overline{RAS}$ signal (which is known as the $\overline{CAS}$-before-$\overline{RAS}$ mode) is used for selectively setting function mode other than the auto-refresh mode. For this reason, even in the multifunction mode memory, mode specification is effected by the $\overline{CAS}$-before-$\overline{RAS}$ operation in function modes in which no column address is used, and it is desired to keep those function modes in which the $\overline{CAS}$ signal is set at a high level so that the function modes requiring the column address can be selectively set. In this case, there occurs a problem concerning the timing relation between the row address generated from the counter provided in the memory and the row address externally supplied. Now, the problem is explained in detail with reference to FIGS. 1 and 2.

As shown in FIG. 1, an external address signal and an internal address signal (generated from the counter in the device) are supplied to address buffer circuit 11. The operation of address buffer circuit 11 is controlled by the $\overline{RAS}$ and $\overline{CAS}$ signals. An output of address buffer circuit 11 is supplied to word line selection/driving circuit 12.

With the circuit construction shown in FIG. 1, when the row address included in an external address is fetched at the time of fall of the $\overline{RAS}$ signal, set-up time $t_{ASR}$ and hold time $t_{RAH}$ of the external address are precisely determined with respect to the time of fall of the $\overline{RAS}$ signal as shown in FIG. 2. Therefore, in the auto-refresh mode in which the internal address is fetched, it is necessary to fully shift or change the levels of the external address and internal address during the time between the beginning of set-up time $t_{ASR}$ and the end of hold time $t_{RAH}$. In order to meet this requirement, set-up time $t_{CSR}$ of the $\overline{CAS}$ signal in the case of setting the $\overline{CAS}$-before-$\overline{RAS}$ mode is set to be longer than the minimum value $t_{ASRmin}$ of set-up time $t_{ASR}$. As a result, it becomes possible to determine whether the circuit is in the auto-refresh mode or not before the row address is fetched. Therefore, address buffer circuit 11 can select one of the external and internal addresses to be fetched during the time of set-up time $t_{ASR}$ and hold time $t_{RAH}$. Further, it will not take additional time to effect data transfer from address buffer circuit 11 to word line selection/driving circuit 12 in comparison with the memory system having no auto-refresh mode.

However, in a case where an operation mode which requires the external address and is different from the auto-refresh mode is specified by the $\overline{CAS}$-before-$\overline{RAS}$ operation, the mode specification cannot be effected only by detection of a high or low level of the $\overline{CAS}$ signal. This problem commonly occurs in semiconductor integrated circuit devices (DRAM integrated circuit device, image processing memory integrated circuit device and the like) having a DRAM which requires the operation of specifying an operation mode other than the auto-refresh mode by use of the $\overline{CAS}$-before-$\overline{RAS}$ operation.

Further, in a mode other than the $\overline{CAS}$-before-$\overline{RAS}$ mode, it is desired that the timings applicable to the conventional DRAM can be set. This is because a semiconductor integrated circuit device additionally having the DRAM mode can be attained without providing an additional circuit or changing the memory system.

SUMMARY OF THE INVENTION

An object of this invention is to provide a semiconductor integrated circuit device having an operation mode setting circuit which can set an operation mode or modes other than the auto-refresh mode by the $\overline{CAS}$-before-$\overline{RAS}$ operation without lowering the operation speed.

Another object of this invention is to provide a semiconductor integrated circuit device having an operation mode setting circuit which can set timings applicable to the conventional DRAM in a mode other than the $\overline{CAS}$-before-$\overline{RAS}$ mode.

According to one embodiment of this invention, there is provided an operation mode setting circuit comprising a first buffer circuit for converting the level of a mode setting signal supplied from the exterior; a second buffer circuit for converting the level of a column address strobe signal; a mode selection circuit for latching and outputting a mode selection signal in response to output signals of the first and second buffer circuits; a latching circuit for receiving an address signal supplied from the exterior and an address signal formed in an internal circuit, latching one of the received address signals in response to the mode selection signal from the mode selection circuit and the row address strobe signal, and outputting the latched signal to the internal circuit; and a control signal generation circuit for generating a control signal for controlling the operation of the latching circuit based on the row address strobe signal and auto-refresh signal.

With this construction, not only the determination of high or low level of the $\overline{CAS}$ signal but also the determination of high or low level of the externally supplied mode setting signal is used for mode setting. Therefore, it becomes possible to specify an operation mode which is different from the auto-refresh mode and requires an external address by the $\overline{CAS}$-before-$\overline{RAS}$ operation. Further, when mode selection is effected by the $\overline{CAS}$-before-$\overline{RAS}$ operation, the externally supplied mode setting control signal is set up before the set-up of the external address input. Therefore, it is possible to determine the mode before the row address is received. In other words, it becomes possible to previously select the external address or internal address as the address to be received into the address buffer circuit. Thus, it is not necessary to take time for address change at the time of mode setting, thus preventing the operation speed from being lowered.

Further, in a mode other than the $\overline{CAS}$-before-$\overline{RAS}$ mode, since the minimum value of the set-up time of the mode setting signal is set to be equal to that of the set-up time of the external address input, it is possible to set timings applicable to the conventional DRAM. In this way, the circuit device can be used as a DRAM integrated circuit device which additionally has the conventional DRAM mode.

BRIEF DESCRIPTION OF THE DRAWINGS

FIG. 5 is a timing chart showing the signal accepting period of each buffer circuit in the circuit of FIG. 3;

FIG. 6A shows an example of the construction of the buffer circuit shown in FIG. 3;

FIG. 6B is a diagram illustrating the operation of the circuit shown in FIG. 6A;

FIG. 8 is a diagram showing modes determined by the output of the circuit shown in FIG. 7A and a mode setting control signal;

FIG. 9 is a diagram showing an example of the construction of a circuit for generating an auto-refresh signal shown in FIG. 8;

FIG. 10 is a diagram showing an example of the construction of a circuit for generating a signal indicating a special operation mode shown in FIG. 8;

FIG. 11A is a circuit diagram showing an example of the construction of a 1-bit external address receiving section in the address buffer circuit shown in FIG. 3;

FIG. 11B is a circuit diagram showing an example of the construction of a 1-bit address selecting section in the address buffer circuit shown in FIG. 3;

FIG. 12 is a diagram showing an example of the construction of a control signal generating circuit shown in FIG. 3; and FIG. 13 is a timing chart showing the relation between various signals in the circuit of FIG. 12 and a latch signal used in the mode setting circuit shown in FIG. 7A.

DETAILED DESCRIPTION OF THE PREFERRED EMBODIMENTS

Figure 1:
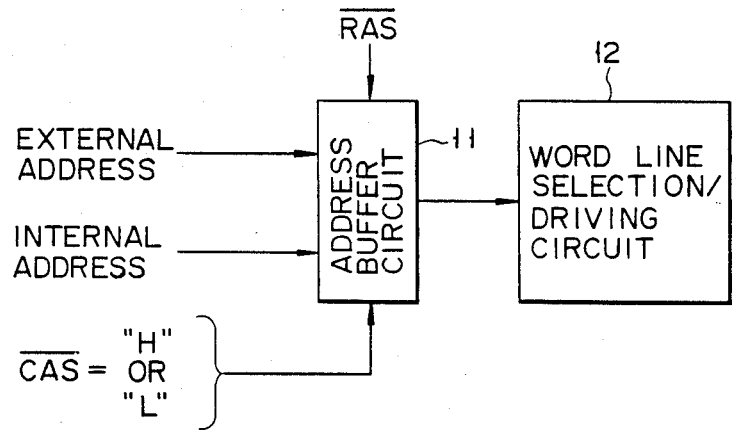
FIG. 1 is a block diagram of an operation mode setting section and a peripheral circuit of the conventional DRAM integrated circuit device.
Figure 2:
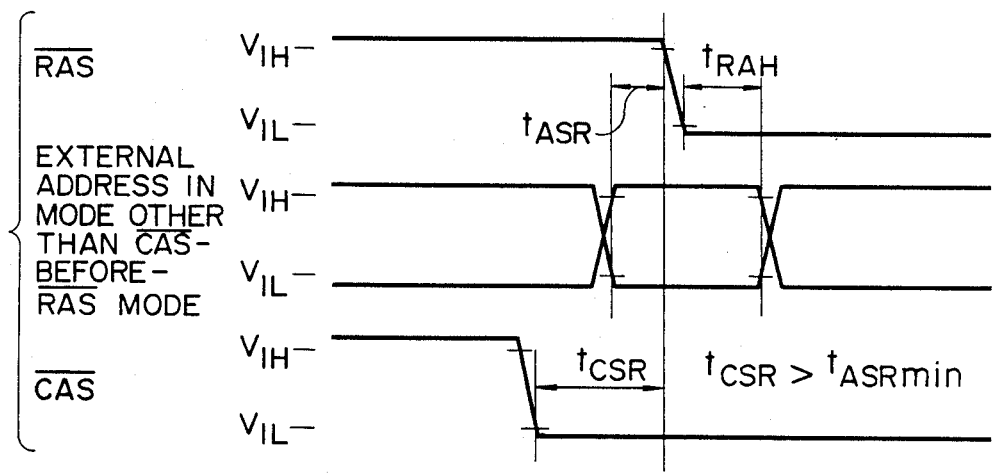
FIG. 2 is a timing chart of various signals in the circuit of FIG. 1.
Figure 3:
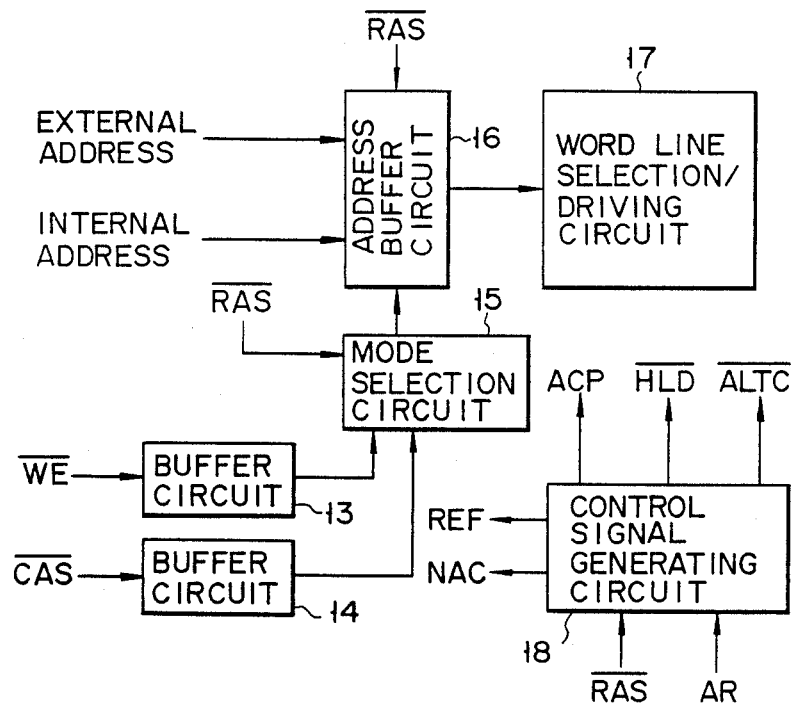
FIG. 3 is a block diagram showing an operation mode setting circuit according to one embodiment of this invention.

FIG. 3 shows an operation mode setting circuit according to one embodiment of this invention. The operation mod setting circuit is provided in a DRAM section of an image processing integrated circuit device, for example. A mode setting signal (which is represented by $\overline{WE}$ as an example, but a different signal or signals can be used) is supplied to buffer circuit 13 and the level thereof is converted (for example, from the TTL level to the internal "H" or "L" level). The $\overline{CAS}$ signal is supplied to buffer circuit 14 and the level thereof is converted. Mode selection circuit 15 latches a mode selection signal in response to the outputs of buffer circuits 13 and 14 when the $\overline{RAS}$ signal is activated, and produces the mode selection signal. Address buffer circuit 16 for the row address is controlled by the mode selection signal and $\overline{RAS}$ signal to select one of the external address (row address) and the internal address (row address output from the address counter in the device). The output of address buffer circuit 16 is supplied to word line selection/driving circuit 17. The $\overline{RAS}$ signal and auto-refresh (AR) signal are supplied to control signal generation circuit 18, and various control signals $\overline{HLD}$, ACP, $\overline{ALTC}$, NAC and REF used for controlling address buffer circuit 16 are formed based on the $\overline{RAS}$ signal and AR signal.

Figure 4:
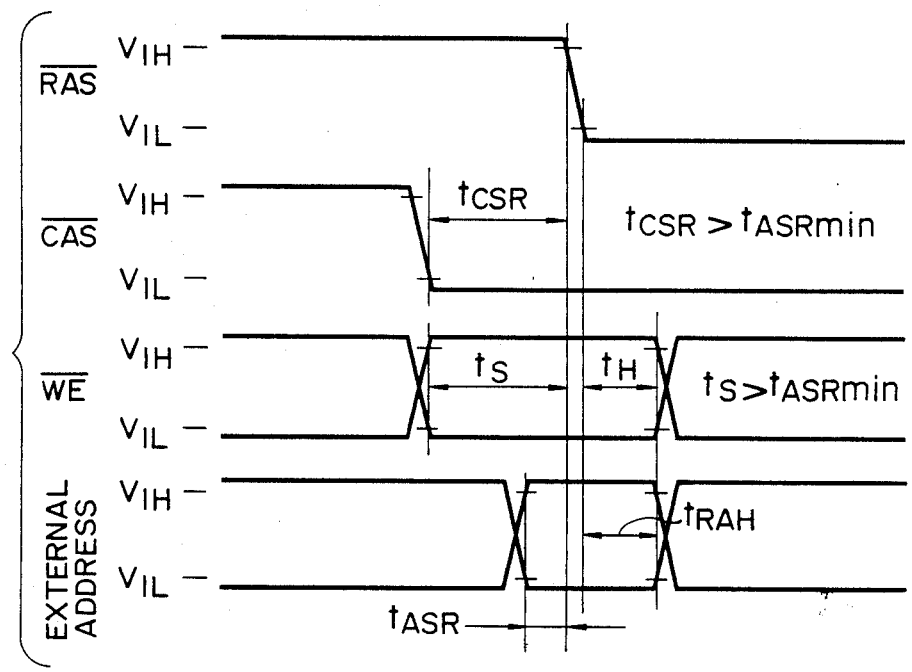
FIG. 4 is a timing chart of various signals in the circuit of FIG. 3.

FIG. 4 shows an example of the timing relation of the $\overline{RAS}$ signal, $\overline{CAS}$ signal, $\overline{WE}$ signal and external address signal in the $\overline{CAS}$-before-$\overline{RAS}$ mode in the operation mode setting circuit shown in FIG. 3. Assume now that the set-up time of the $\overline{CAS}$ signal with respect to the $\overline{RAS}$ signal is $t_{CSR}$, the set-up time of the $\overline{WE}$ signal with respect to the $\overline{RAS}$ signal is $t_S$, the hold time of the $\overline{WE}$ signal is $t_H$, the set-up time of the external address with respect to the $\overline{RAS}$ signal is $t_{ASR}$, and the hold time of the external address is $t_{RAH}$. In this case, like the conventional case, set-up time $t_{CSR}$ is set to be larger than minimum value $t_{ASRmin}$ of set-up time $t_{ASR}$. Further, in this embodiment, minimum value $t_{Smin}$ of set-up time $t_S$ is set to be equal to minimum value $t_{CSRmin}$ of set-up time $t_{CSR}$ ($t_{Smin} = t_{CSRmin}$). However, it is possible to make the condition less strict, and in this case, it is sufficient if set-up time $t_S$ is set to be larger than minimum value $t_{ASRmin}$ of set-up time $t_{ASR}$ ($t_S > t_{ASRmin}$).

With the DRAM of the above construction, the $\overline{WE}$ signal is determined to set a mode before the address signal is received by address buffer circuit 16. That is, the $\overline{WE}$ and $\overline{CAS}$ signals are supplied to mode selection circuit 15 via buffer circuit 13 and 14 in a sequence of operations starting from the time of fall of the $\overline{RAS}$ signal. Either the external address or the internal address is selected by the mode selection signal supplied from mode selection circuit 15 and is received by address buffer circuit 16. In this way, it is not necessary to additionally provide mode determination time in a period from the time of fall of the $\overline{RAS}$ signal until the address latching, thus preventing the operation speed from being lowered.

In order to effect the mode determination in a mode other than the $\overline{CAS}$-before-$\overline{RAS}$ mode in the same timing as those in conventional DRAMS, the following operation is effected. When this timing system is used, address buffer circuit 16 receives only the external address, and therefore the selecting operation of address buffer circuit 16 is not necessary. In other words, it is not necessary to set the condition ($t_S > t_{ASRmin}$) for set-up time $t_S$ of the $\overline{WE}$ signal, and in this case set-up time $t_S$ may be set approximately equal to $t_{ASR}$. In order to permit the timings to be varied within a certain range, it is only necessary to set the signal accepting period (hatched portion) in which the output signals from buffer circuits 13 and 14 are permitted to be accepted or received by mode selection circuit 15 and the signal accepting period of buffer circuit 16 as shown in FIG. 5. That is, the address accepting period of address buffer circuit 16 starts at the time of fall of the $\overline{RAS}$ signal and ends within minimum period $t_{RAHmin}$ of hold time $t_{RAH}$ so as to meet the timing condition of hold time $t_{RAH}$. In a period other than the above period, the accepted address is latched if the $\overline{RAS}$ signal is activated. In contrast, the accepting period in which the output signals of buffer circuits 13 and 14, for example, signals $\overline{CAS}$ and $\overline{WE}$ relating to the mode determination are permitted to be accepted by mode selection circuit 15 starts at the time of rise of the $\overline{RAS}$ signal and ends within minimum period $t_{Hmin}$ of hold time $t_H$ so as to meet the timing condition of hold time $t_H$. In this case, data accepting condition is always set when the $\overline{RAS}$ signal rises, and thus no problem occurs even if mode determination must be made before the fall of the $\overline{RAS}$ signal in the $\overline{CAS}$-before-$\overline{RAS}$ mode, for example.

With the DRAM section having the above operation mode setting circuit, the high and low levels of the mode setting signal, for example, $\overline{WE}$ signal can be used in addition to the high and low levels of the $\overline{CAS}$ signal. Therefore, it becomes possible to specify a mode which is different from the auto-refresh mode and requires the external address by the $\overline{CAS}$-before-$\overline{RAS}$ operation. Further, since, in the $\overline{CAS}$-before-$\overline{RAS}$ mode, the set-up times are set to satisfy the condition "$t_S > t_{ASR}$", it is not necessary to provide mode determination time in a period from the time of fall of the $\overline{RAS}$ signal until the address latching, thus preventing the operation speed from being lowered. Also, it is possible to set the timings applicable to the conventional DRAM ($t_{Smin} = t_{ASRmin}$) in a mode other than the $\overline{CAS}$-before-$\overline{RAS}$ mode, and therefore the $\overline{CAS}$-before-$\overline{RAS}$ mode can be used as an expansion of the conventional DRAM mode.

Each of buffer circuits 13 and 14 is constituted as shown in FIG. 6A. In this circuit, mode control signal $\overline{CAS}$ (or write enable signal $\overline{WE}$ or output enable signal $\overline{OE}$) at the TTL level is converted to a signal of the CMOS logic level by means of level conversion circuit 19. Level conversion circuit 19 includes P-channel MOS transistors 20 and 21, N-channel MOS transistors 22 to 24, and CMOS inverters 25 and 26. The current paths of MOS transistors 20 to 23 are serially connected between power source $V_{DD}$ and the ground terminal. A connection node between MOS transistors 21 and 22 is connected to the input terminal of inverter 25. The current path of MOS transistor 24 is connected between the above connection node and a connection node between MOS transistors 22 and 23, and the gate thereof is connected to the output terminal of inverter 25. The output terminal of inverter 25 is further connected to the input terminal of inverter 26. Internal signal $\overline{CIN}$ (or $\overline{WIN}$ or $\overline{OIN}$) is extracted from the output terminal of inverter 26 and is inverted by inverter 27 and converted into internal signal CIN (or WIN or OIN). FIG. 6B shows the truth values of the respective signals in the circuit shown in FIG. 6A.

Figures 7A, 7B:
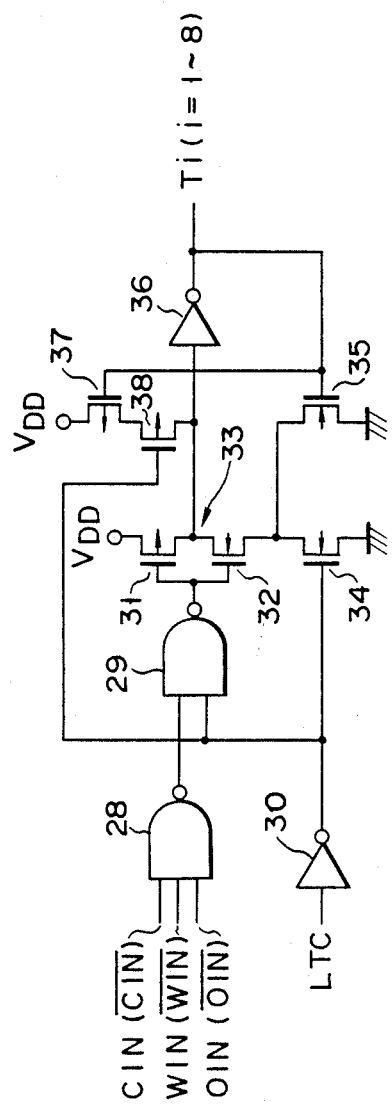
FIG. 7A shows an example of the construction of the mode selection circuit included in the circuit shown in FIG. 3.
FIG. 7B is a diagram illustrating the operation of the circuit shown in FIG. 7A.

Mode selection circuit 15 is formed of eight (maximum) circuits similar in construction to a circuit shown in FIG. 7A and respectively activated in response to different combinations of the levels of internal signals CIN, WIN and OIN (or $\overline{CIN}$, $\overline{WIN}$ and $\overline{OIN}$). Internal signals CIN, WIN and OIN (or $\overline{CIN}$, $\overline{WIN}$ and $\overline{OIN}$) are supplied to the input terminals of NAND gate 28. The output terminal of NAND gate 28 is connected to one of the input terminals of NAND gate 29. Latch signal LTC (refer to the timing chart of FIG. 13) is supplied to the input terminal of inverter 30 whose output terminal is connected to the other input terminal of NAND gate 29. The output terminal of NAND gate 29 is connected to the input terminal of CMOS inverter 33 constituted by P-channel MOS transistor 31 and N-channel MOS transistor 32. The current paths of N-channel MOS transistors 34 and 35 are connected in parallel between one end of the current path of MOS transistor 32 and the ground terminal. The gate of MOS transistor 34 is connected to the output terminal of inverter 30. The output terminal of CMOS inverter 33 is connected to the input terminal of inverter 36 whose output terminal is connected to the gate of MOS transistor 35. Further, the current paths of P-channel MOS transistors 37 and 38 are serially connected between power source $V_{DD}$ and the output terminal of CMOS inverter 33. The gates of MOS transistors 37 and 38 are respectively connected to the output terminals of inverters 36 and 30. Output signal Ti is derived out from the output terminal of inverter 36.

With the construction shown in FIG. 7A, the LTC signal is set to "1" level in response to the fall of the $\overline{RAS}$ signal. When the LTC signal is at "0" level, MOS transistors 34 and 38 are respectively set in the conductive and nonconductive states by output signal "1" of inverter 30. At this time, the level of output signal Ti is determined by a combination of the levels of input signals CIN, WIN and OIN. When the LTC signal is set to "1", output signal Ti is latched and is kept unchanged as long as the LTC signal is kept at "1" level. That is, when the LTC signal is set to "1" level while output signal Ti is kept at "0" level, MOS transistors 38 and 34 are respectively turned on and off by output "0" of inverter 30. Further, since MOS transistors 37 and 35 are set in the on and off states by output signal Ti of "0", the potential of the input terminal of inverter 36 is latched to a potential level which is pulled up by transistors 37 and 38 set in the conductive state. In contrast, when the LTC signal is set to "1" level while output signal Ti is kept at "1" level, transistors 38 and 34 are respectively turned on and off by output signal of "0" of inverter 30. In this case, however, since transistors 35 and 37 are respectively set in the on and off states by output signal Ti of "1", the potential of the input terminal of inverter 36 is latched to a potential level which is pulled down by transistors 32 and 35 set in the on state.

In this way, the level of output signal Ti (i is 1 to 8 (maximum)) is determined according to one of combinations (maximum 8) of the levels of the $\overline{CAS}$, $\overline{WE}$ and $\overline{OE}$ signals at the time of fall of the $\overline{RAS}$ signal. FIG. 7B shows the truth values obtained by the circuit of FIG. 7A.

The relation between the Ti output signal and the actual operation mode is determined according to the specification of the integrated circuit device, for example, it is determined as shown in FIG. 8. In this case, the auto-refresh mode is selected by the auto-refresh (AR) signal which is obtained by deriving the logical sum of the T1 and T3 output signals as shown in FIG. 9 by use of NOR gate 39 and inverter 40. The auto-refresh mode is a mode in which the external and internal addresses are selectively changed. Therefore, it is necessary to immediately generate the AR signal by the T1 or T3 output signal. The normal read/write mode, special function 1 mode, special function 2 mode and special function 3 mode which are different from the auto-refresh mode are selectively set by signals N, SF1, SF2 and SF3 which are each derived out by the Ti signal shown in FIG. 8. At this time, it is necessary that no operation mode is set before the Ti output signal is determined and kept unchanged (before the LTC signal rises). For this reason, signal N and the like are set to "1" after the LTC signal is set to "1". In order to attain this operation, for example, a signal formation circuit for the special function 1 (SF1) signal is constructed as shown in FIG. 10. That is, the T2 and T5 output signals are supplied to NOR gate 45 constituted by P-channel MOS transistors 41 and 42 and N-channel MOS transistors 43 and 44. The current path of switching N-channel MOS transistor 46 is connected between one end of the current paths of MOS transistors 43 and 44 of NOR gate 45 and the ground terminal. The output terminal of NOR gate 45 is connected to the input terminal of inverter 47 and the current path of pull-up P-channel MOS transistor 48 is connected between the output terminal thereof and power source $V_{DD}$. The LTC signal is supplied to the gates of transistors 46 and 48. When the LTC signal is set at "0" level, transistors 46 and 48 are respectively set in the off and on states. As a result, the potential of the input terminal of inverter 47 becomes "1" level and output SF1 becomes "0" level. When the LTC signal is set to "1" level, transistors 46 and 48 are respectively set in the on and off states so that the output signal of NOR gate 45 is inverted by inverter 47 and thus the logical sum output SF1 of the T2 and T5 inputs ca be derived.

Signal N can be derived by a circuit similar to the circuit of FIG. 10, and signals SF2 and SF3 can be respectively derived based on the T4 and T8 outputs by use of a circuit similar to the circuit of FIG. 10 when the LTC signal becomes "1" level.

Part of address buffer circuit 16 for processing one bit is shown in FIGS. 11A and 11B as an example. FIG. 11A shows an external address receiving section and FIG. 11B an address selection section (for selecting and outputting an internal address from the address counter of the device or external address A, $\overline{A}$ from the external address receiving section according to whether or not the auto-refresh mode is set). The external address receiving section shown in FIG. 11A includes MOS transistors 49 to 56 and differential amplifier circuit 57 connected as shown in FIG. 11A. That is, the current paths of P-channel MOS transistor 55 and N-channel MOS transistors 49 and 51 are serially connected between power source $V_{DD}$ and the ground terminal. The gate of MOS transistor 55 is grounded and the gate of MOS transistor 49 is connected to receive control signal ACP. Further, the gate of MOS transistor 51 is connected to one end of the current path of N-channel MOS transistor 50. The other end of the current path of MOS transistor 50 is connected to receive an external address signal and the gate thereof is connected to receive control signal $\overline{HLD}$. Likewise, the current paths of P-channel MOS transistor 56 and N-channel MOS transistors 52 and 54 are serially connected between power source $V_{DD}$ and the ground terminal. The gate of MOS transistor 56 is grounded and the gate of MOS transistor 52 is connected to receive control signal ACP. Further, the gate of MOS transistor 54 is connected to one end of the current path of N-channel MOS transistor 53. The other end of the current path of MOS transistor 53 is connected to receive reference potential $V_{REF}$ and the gate thereof is connected to receive control signal $\overline{HLD}$. Differential amplifier circuit 57 includes two CMOS inverters having input and output terminals cross-coupled. One of the connection nodes between the input terminals and the corresponding output terminals thereof is connected to a connection node between MOS transistors 55 and 49, and the other connection node is connected to a connection node between MOS transistors 56 and 52. The operation of differential amplifier circuit 57 is controlled by control signal $\overline{ALTC}$. Address signal $\overline{A}$ is output from the connection node between MOS transistors 55 and 49, and address signal A is output from the connection node between MOS transistors 56 and 52.

With the above construction, the external address bit and reference potential $V_{REF}$ are fetched when control signal $\overline{HLD}$ is at "1" level. The above two input signals are supplied to differential amplifier circuit 57 when control signal ACP is at "1" level. When control signal $\overline{ALTC}$ becomes "0", differential amplifier circuit 57 amplifies the difference between the two input signals and outputs address signals A and $\overline{A}$.

The address selection section shown in FIG. 11B includes MOS transistors 58 to 61, latch circuits 62 and 63, and pull-down circuit 64 connected as shown in FIG. 11B. That is, address signals A and $\overline{A}$ are respectively supplied to one ends of the current paths of N-channel MOS transistors 58 and 59 whose gates are connected to receive control signal NAC. The other end of the current path of MOS transistor 58 is connected to the input terminal of latch circuit 62, and the other end of the current path of MOS transistor 59 is connected to the input terminal of latch circuit 63. Each of latch circuits 62 and 63 is constituted by two inverters having their input and output terminals cross-coupled. The internal addresses generated from the internal counter are respectively supplied to one ends of the current paths of N-channel MOS transistors 60 and 61 whose gates are connected to receive control signal REF. The other end of the current path of MOS transistor 60 is connected to the input terminal of latch circuit 62, and the other end of the current path of MOS transistor 61 is connected to the input terminal of latch circuit 63. Pull-down circuit 64 is connected between the output terminals of latch circuits 62 and 63. Pull-down circuit 64 includes two N-channel MOS transistors each having a gate connected to one end of the current path of the other MOS transistor, and the other end of each of the current paths of the MOS transistors is grounded. Latch output signals B and $\overline{B}$ from the output terminals of latch circuits 62 and 63 are supplied to a row decoder (not shown).

Now, the operation of the circuit shown in FIG. 11B is explained. First, address signals A and $\overline{A}$ are received by control signal NAC of "1" level, and the internal address from the internal counter is received by control signal REF of "1" level. The received signals are latched by latch circuits 62 and 63 and latched outputs B and $\overline{B}$ are supplied to a row decoder in word line selection/driving circuit 17 included in the circuit of FIG. 3. In this case, that one of outputs B and $\overline{B}$ of latching circuits 62 and 63 which is set at a lower level is lowered to "0" level by means of pull-down circuit 64.

Control signals $\overline{HLD}$, ACP, $\overline{ALTC}$, NAC and REF are formed based on the AR signal and a negative pulse generated in synchronism with the fall of the $\overline{RAS}$ signal by control signal generation circuit 18 as shown in FIG. 12. Signal ACP is obtained by inverting the negative pulse signal by inverter 65, and signal $\overline{HLD}$ is obtained by sequentially inverting the negative pulse signal by means of inverters 65 and 66. Further, signal $\overline{ALTC}$ is obtained by sequentially inverting the negative pulse signal by means of inverters 65 and 67 to 69. Signal REF is obtained by supplying an inverted signal from inverter 70 for inverting the negative pulse signal and the AR signal to NAND gate 71 and then inverting the output of NAND gate 71 by means of inverter 72. Further, signal NAC is obtained by supplying the negative pulse signal and AR signal to NOR gate 73 and then sequentially inverting the output of NOR gate 73 by means of inverters 74 and 75.

FIG. 13 shows the timing relation between the LTC signal and various signals in the circuit of FIG. 12. In this case, signals ACP and $\overline{HLD}$ are supplied to address buffer circuit 16, and the set-up time and the hold time are determined by the timings of the rise of signal ACP and the fall of signal $\overline{HLD}$. Further, in order to set hold time $t_{RAH}$ of the external address equal to hold time $t_H$ of the mode setting signal, the fall of signal $\overline{HLD}$ and the rise of the LTC signal used in mode setting circuit 15 are set to occur at the same time.

As described above, according to this invention, the DRAM section can be set into a mode other than the auto-refresh mode by the $\overline{CAS}$-before-$\overline{RAS}$ operation. At this time, since the operation speed is not lowered so much, it is very effective when used in the image memory integrated circuit requiring high speed operation. Further, in a mode other than the $\overline{CAS}$-before-$\overline{RAS}$ mode, the timings applicable to the conventional DRAM integrated circuit can be set. Therefore, it can be used as a DRAM integrated circuit device additionally having the DRAM mode without providing an additional circuit or changing the memory system.

What is claimed is:

1. An operation mode setting circuit for a dynamic random access memory comprising:
   first means for converting the level of a mode setting signal;
   second means for converting the level of a column address strobe signal;
   mode selection means for latching and outputting a mode selection signal in response to output signals from said first means, said second means and a row address strobe signal;
   latching means responsive to said mode selection signal and said row address strobe signal for latching one of an exterior address signal and an interior address signal, and for outputting a latched signal;
   word line selection means for selecting a word line of said dynamic random access memory in response to said latched signal; and
   control signal generation means for generating a control signal for controlling said latching means in response to said row address strobe signal and an auto-refresh signal which controls an auto-refresh mode.

2. An operation mode setting circuit according to claim 1, wherein the mode setting signal is set up with respect to the row address strobe signal, in a case where a mode other than the auto-refresh mode is specified in an operation mode in which the column address strobe signal is activated before the row address strobe signal, a minimum signal holding time to set-up the mode setting signal is set to be larger than a minimum signal holding time to set-up the external address signal, the mode setting signal is latched by said mode selection means at the time the row address strobe signal is activated and the latched signal is used to select and control the operation mode.

3. An operation mode setting circuit according to claim 1, wherein a minimum signal holding time to set-up the column address strobe signal is set to be larger than a minimum signal holding time to set-up the external address signal, and a minimum signal holding time to set-up the externally supplied mode setting signal is set to be equal to the the minimum signal holding time to set-up the column address strobe signal.

4. An operation mode setting circuit according to claim 1, wherein a minimum signal holding time to set-up the column address strobe signal is set to be larger than a minimum signal holding time to set-up the external address signal, and a minimum signal holding time to set-up the externally supplied mode setting signal is set to be larger than the value of the minimum signal holding time to set-up the external address signal.

5. An operation mode setting circuit according to claim 1, wherein the mode setting signal includes at least one of write enable signal and output enable signal.

6. An operation mode setting circuit according to claim 1, wherein each of said first and second means for converting includes a level conversion circuit for converting the level of an input signal to a CMOS logic level, and an inverter for forming a complementary signal based on an output signal of said level conversion circuit.

7. An operation mode setting circuit according to claim 6, wherein said level conversion circuit includes a first MOS transistor of a first conductivity type having a current path which is connected at one end to a first potential supplying source and a gate connected to a second potential supplying source; a second MOS transistor of the first conductivity type having a current path which is connected at one end to the other end of the current path of said first MOS transistor and a gate connected to receive the mode setting signal; a third MOS transistor of a second conductivity type having a current path which is connected at one end to the other end of the current path of said second MOS transistor and a gate connected to receive the mode setting signal; a fourth MOS transistor of the second conductivity type having a current path connected between the other end of the current path of said third MOS transistor and said second potential supplying source and a gate connected to receive the mode setting signal; a first inverter having an input terminal connected to a connection node between said second and third MOS transistors; a fifth MOS transistor of the second conductivity type having a current path connected at one end to the connection node between said second and third MOS transistors and connected at the other end to a connection node between said third and fourth MOS transistors and a gate connected to the output terminal of said first inverter; and a second inverter having an input terminal connected to the output terminal of said first inverter.

8. An operation mode setting circuit according to claim 1, wherein said mode selection means includes a first NAND gate connected to receive output signals from said first and second means for converting; a first inverter having an input terminal connected to receive a latch signal; a second NAND gate having a first input terminal connected to an output terminal of said first NAND gate and a second input terminal connected to an output terminal of said first inverter; a first MOS transistor of a first conductivity type having a current path which is connected at one end to a first potential supplying source and a gate connected to an output terminal of said second NAND gate; a second MOS transistor of a second conductivity type having a current path which is connected at one end to the other end of the current path of said first MOS transistor and a gate connected to the output terminal of said second NAND gate; a third MOS transistor of the second conductivity type having a current path connected between the other end of the current path of said second MOS transistor and a second potential supplying source, and a gate connected to the output terminal of said first inverter; a second inverter having an input terminal connected to a connection node between said first and second MOS transistors; a fourth MOS transistor of the second conductivity type having a current path which is connected at one end to a connection node between said second and third MOS transistors and connected at the other end to said second potential supplying source, and a gate connected to the output terminal of said second inverter; and fifth and sixth MOS transistors of the first conductivity type having current paths connected in series between said first potential supplying source and the input terminal of said second inverter, the gate of one of said fifth and sixth MOS transistors being connected to the output terminal of said second inverter and the other gate being connected to the output terminal of said first inverter; and wherein a mode selection signal is derived from the output terminal of said second inverter.

9. An operation mode setting circuit according to claim 1, wherein said latching means includes an address buffer circuit.

10. An operation mode setting circuit according to claim 9, wherein said address buffer circuit includes an external address receiving section and an address selecting section.

11. An operation mode setting circuit according to claim 10, wherein a one-bit processing circuit portion of said external address receiving section includes a first MOS transistor of a first conductivity type having a current path connected at one end to a first potential supplying source and a gate connected to a second potential supplying source; a second MOS transistor of a second conductivity type having a current path connected at one end to the other end of the current path of said first MOS transistor and a gate connected to receive a first control signal generated from said control signal generating means; a third MOS transistor of the second conductivity type having a current path connected at one end to receive an external address signal and a gate connected to receive a second control signal generated from said control signal generating means; a fourth MOS transistor of the second conductivity type having a current path connected between the other end of the current path of said second MOS transistor and said second potential supplying source, and a gate connected to the other end of the current path of said third MOS transistor; a fifth MOS transistor of the first conductivity type having a current path connected at one end to said first potential supplying source and a gate connected to said second potential supplying source; a sixth MOS transistor of the second conductivity type having a current path connected at one end to the other end of the current path of said fifth MOS transistor and a gate connected to receive the first control signal generated from said control signal generating means; a seventh MOS transistor of the second conductivity type having a current path connected at one end to receive a reference voltage and a gate connected to receive said second control signal generated from said control signal generating means; an eighth MOS transistor of the second conductivity type having a current path connected between the other end of the current path of said sixth MOS transistor and said second potential supplying source, and a gate connected to the other end of the current path of said seventh MOS transistor; and a differential amplifier circuit which has a first input terminal connected to a connection node between said first and second MOS transistors and a second input terminal connected to a connection node between said fifth and sixth MOS transistors and whose operation is controlled by a third control signal generated from said control signal generating means; and a first address signal is derived from the connection node between said first and second MOS transistors, and a second address signal which is in the inverted form of the first address signal is derived from the connection node between said fifth and sixth MOS transistors.

12. An operation mode setting circuit according to claim 11, wherein said differential amplifier circuit includes a first inverter and a second inverter having input and output terminals respectively connected to the output and input terminals of said first inverter.

13. An operation mode setting circuit according to claim 10, wherein said address selecting section includes first and second MOS transistors each having a current path connected at one end to receive a corresponding output signal of said external address receiving section and a gate connected to receive a fourth control signal generated from said control signal generating means; third and fourth MOS transistors each having a current path connected at one end to receive a corresponding one of the internal address signals and a gate connected to receive a fifth control signal generated from said control signal generating means; a first latching circuit having an input terminal connected to the other ends of the current paths of said first and third MOS transistors; a second latching circuit having an input terminal connected to the other ends of the current paths of said second and fourth MOS transistors; and a pull-down circuit connected between the output terminals of said first and second latching circuits; the output signals of said first and second latching circuits are supplied to said word line selection means.

14. An operation mode setting circuit according to claim 13, wherein each of said first and second latching circuits includes a first inverter and a second inverter whose input and output terminals are respectively connected to the output and input terminals of said first inverter.

15. An operation mode setting circuit according to claim 13, wherein said pull-down circuit includes a first MOS transistor having a current path connected between the output terminal of said first latching circuit and a second potential supplying source, and a gate connected to the output terminal of said second latching circuit; and a second MOS transistor having a current path connected between the output terminal of said second latching circuit and said second potential supplying source, and a gate connected to the output terminal of said first latching circuit.

16. An operation mode setting circuit according co claim 1, wherein said control signal generating means includes a first inverter having an input terminal connected to receive a negative pulse signal generated in synchronism with the row address strobe signal; a second inverter having an input terminal connected to the output terminal of said first inverter; a third inverter having an input terminal connected to the output terminal of said first inverter; a fourth inverter having an input terminal connected to the output terminal of said third inverter; a fifth inverter having an input terminal connected to the output terminal of said fourth inverter; a sixth inverter having an input terminal connected to receive the negative pulse signal; a NAND gate having a first input terminal connected to the output terminal of said sixth inverter and a second input terminal connected to receive an auto-refresh signal; a seventh inverter having an input terminal connected to the output terminal of said NAND gate; a NOR gate having a first input terminal connected to receive the negative pulse signal and a second input terminal connected to receive the auto-refresh signal; an eighth inverter having an input terminal connected to the output terminal of said NOR gate; and a ninth inverter having an input terminal connected to the output terminal of said eighth inverter; and wherein a first control signal is derived from the output terminal of said first inverter, a second control a signal is derived from the output terminal of said second inverter, a third control signal is derived from the output terminal of said fifth inverter, a fourth control signal is derived from the output terminal of said ninth inverter, and a fifth control signal is derived from the output terminal of said seventh inverter.

17. An operation mode setting circuit according to claim 1, wherein said mode selection means can accept data in a period during which the row address strobe signal is set in the activated state and in a preset period of time after the row address strobe signal has been set into the activated state; and said latching means accepts one of the address signals when the row address strobe signal is in the activated state, and interrupts the reception of the address signal after a predetermined period of time.

* * * * *